United States Patent
Jin

(10) Patent No.: US 9,059,202 B2
(45) Date of Patent: Jun. 16, 2015

(54) METAL-OXIDE-SEMICONDUCTOR (MOS) DEVICE AND METHOD FOR FABRICATING THE SAME

(75) Inventor: Yan Jin, Wuxi (CN)

(73) Assignees: CSMC TECHNOLOGIES FAB1 CO., LTD., Wuxi (CN); CSMC TECHNOLOGIES FAB2 CO., LTD., Wuxi (CN)

( * ) Notice: Subject to any disclaimer, the term of this patent is extended or adjusted under 35 U.S.C. 154(b) by 145 days.

(21) Appl. No.: 13/807,315

(22) PCT Filed: Nov. 30, 2011

(86) PCT No.: PCT/CN2011/083231
§ 371 (c)(1),
(2), (4) Date: Dec. 28, 2012

(87) PCT Pub. No.: WO2012/083787
PCT Pub. Date: Jun. 28, 2012

(65) Prior Publication Data
US 2013/0134525 A1 May 30, 2013

(30) Foreign Application Priority Data
Dec. 24, 2010 (CN) .......................... 2010 1 0603672

(51) Int. Cl.
| | |
|---|---|
| *H01L 21/02* | (2006.01) |
| *H01L 29/66* | (2006.01) |
| *H01L 29/423* | (2006.01) |
| *H01L 29/78* | (2006.01) |

(52) U.S. Cl.
CPC .... *H01L 29/66477* (2013.01); *H01L 29/42368* (2013.01); *H01L 29/7836* (2013.01); *H01L 29/78* (2013.01)

(58) Field of Classification Search
CPC ............ H01L 2924/00; H01L 29/7869; H01L 2224/48227; H01L 27/1225; H01L 2224/32225; H01L 2224/73265; H01L 29/66969; H01L 2924/00014; H01L 2224/73204; H01L 2224/48465; C12Q 1/6869; C12Q 2565/631

USPC .......... 257/408, E21.611, E21.625, E21.628, 257/E21.635, E21.636, E21.637, E21.64, 257/E21.642, E21.651, E21.26, E21.691, 257/E27.004, E27.06, E27.061, E27.062, 257/E27.071, E27.092, E27.111, E27.112, 257/E27.132, E27.134, E27.135, E29.04, 257/E29.053, E29.068, E29.1, E29.117, 257/E29.132, E29.156, E29.248, E29.256, 257/E29.268, E29.275, E29.277, 40, 192, 257/76, 43, 288, 347, 368, 13, 4, 401, 71, 257/77, 774, 121, 139, 140, 173, 190, 194, 257/197, 20, 24, 25, 265, 29, 291, 314, 327, 257/329, 336, 339, 365, 369, 379, 410, 413, 257/421, 432, 5, 526, 53, 532, 586, 600, 66, 257/72, 762; 438/299–310
See application file for complete search history.

(56) References Cited

U.S. PATENT DOCUMENTS

| | | | | |
|---|---|---|---|---|
| 2005/0287753 A1* | 12/2005 | Chen et al. | ..................... | 438/306 |
| 2006/0211209 A1* | 9/2006 | Yoshino | ........................ | 438/286 |

*Primary Examiner* — Robert Bachner
(74) *Attorney, Agent, or Firm* — Anova Law Group, PLLC

(57) ABSTRACT

A Metal-Oxide-Semiconductor (MOS) device is disclosed. The MOS device includes a substrate, a well region formed in the substrate, and a gate located on the substrate. The MOS device also includes a first lightly-doped region arranged in the well region at a first side of the gate and overlapping with the gate, and a second lightly-doped region arranged in the well region at a second side of the gate and overlapping with the gate. Further, the MOS device includes a first heavily-doped region formed in the first lightly-doped region, and a second heavily-doped region formed in the second lightly-doped region. The MOS device also includes a first high-low-voltage gate oxide boundary arranged between the first heavily-doped region and the gate, and a second high-low-voltage gate oxide boundary arranged between the second heavily-doped region and the gate. The gate covers the first high-low-voltage gate oxide boundary and the second high-low-voltage gate oxide boundary at the first side and the second side of the gate, respectively.

16 Claims, 4 Drawing Sheets

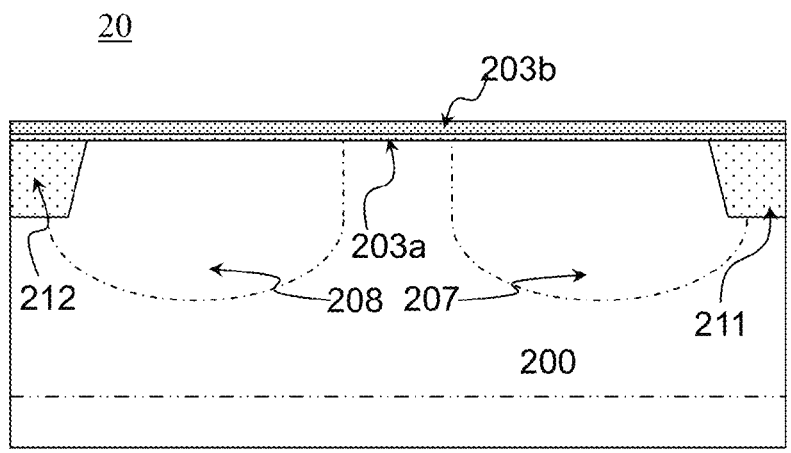
FIG. 5
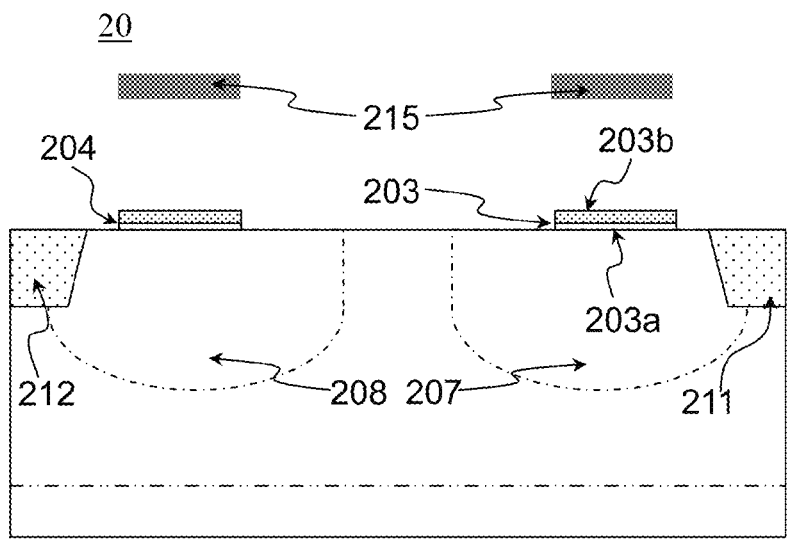
FIG. 6
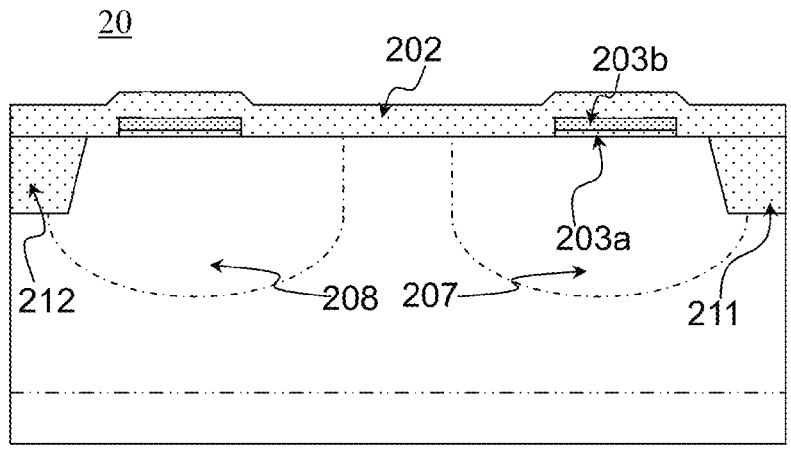

FIG. 7
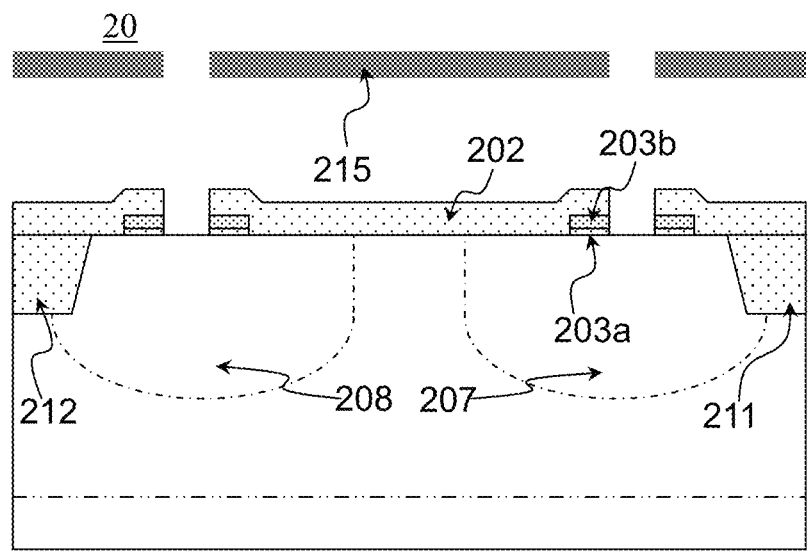
FIG. 8
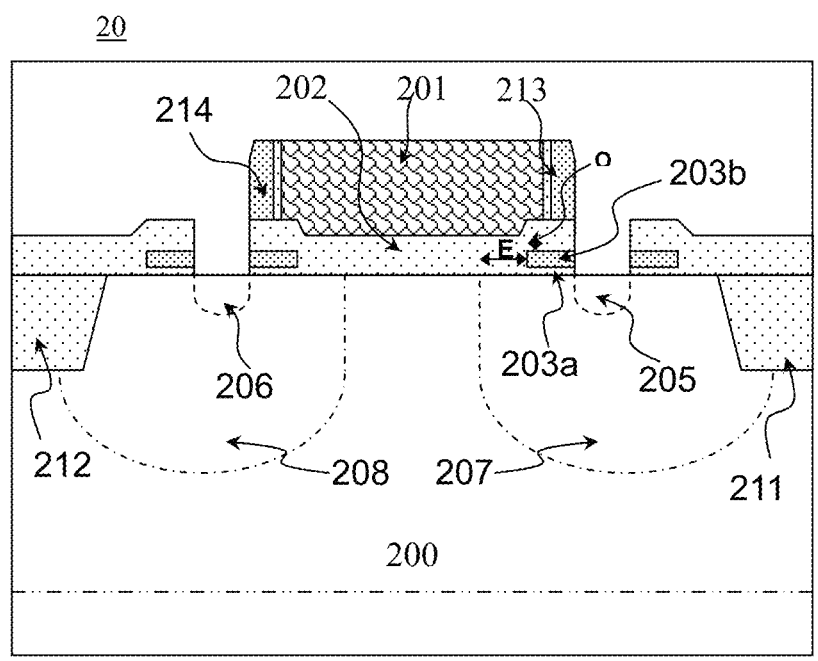
FIG. 9

METAL-OXIDE-SEMICONDUCTOR (MOS) DEVICE AND METHOD FOR FABRICATING THE SAME

FIELD OF THE INVENTION

The present invention generally relates to the field of semiconductor manufacturing and, more particularly, to the Metal-Oxide-Semiconductor (MOS) technologies.

BACKGROUND

A symmetrical high-voltage double-diffused drain device can be formed using the conventional MOS high-voltage integrated circuit (IC) technology. FIG. 1 shows such a MOS device 10. As shown in FIG. 1, MOS device 10 includes: a well region 100, a gate 101, a gate oxide 102, high-low-voltage gate oxide boundaries 103 and 104 symmetrically arranged at each of the two sides of the gate 101, heavily-doped regions 105 and 106 symmetrically arranged in source and drain respectively, lightly-doped regions 107 and 108 symmetrically arranged in source and drain respectively, contact holes 109 and 110 symmetrically arranged in source and drain respectively, and symmetrical shallow trench isolations 111 and 112.

The high-low-voltage gate oxide boundaries 103 and 104 are of an oxide-nitride-oxide (O—N—O) structure, which are used to prevent a low voltage region from being affected by the process of forming a high voltage region. For example, the high-low-voltage gate oxide boundary 103 includes two portions located at two sides of the heavily-doped region 105 horizontally, and a buffer oxide film 103a and a nitride film 103b vertically. The nitride film 103b is used to protect the low voltage region from over-loss of field oxide film and affecting the yield while removing the gate oxide in the low voltage region. The buffer oxide 103a is used for reducing the surface stress of the wafer and buffering the growth of the subsequent nitride film 103b.

More specifically, if the distance between the contact hole 109 and the high-low-voltage gate oxide boundary 103 at one side of the gate 101 is C, the width of the high-low-voltage gate oxide boundary 103 at one side of the gate 101 is W, the distance between the gate 101 and the high-low-voltage gate oxide boundary 103 at one side of the gate 101 is S, and the width of the gate 101 is L, the device space (the distance between the source and drain contact hole 109 and 110) can be expressed as: L+2S+2W+2C.

Therefore, although the high-low-voltage gate oxide boundaries can protect the low voltage region from being affected by the process for forming the high voltage region during the fabricating process, the remaining high-low-voltage gate oxide boundaries at the heavily-doped region 105 and 106 and each of the two sides of the gate 101 may take extra space of the MOS device. With such limitation from the remaining high-low-voltage gate oxide boundaries, it may be difficult to narrow gaps between devices. Thus, it may be difficult to manufacture more devices using the fixed-size wafers, to increase the production efficiency and density of IC integration, or to reduce the cost.

The disclosed methods and systems are directed to solve one or more problems set forth above and other problems.

BRIEF SUMMARY OF THE DISCLOSURE

One aspect of the present disclosure includes a Metal-Oxide-Semiconductor (MOS) device. The MOS device includes a substrate, a well region formed in the substrate, and a gate located on the substrate. The MOS device also includes a first lightly-doped region arranged in the well region at a first side of the gate and overlapping with the gate, and a second lightly-doped region arranged in the well region at a second side of the gate and overlapping with the gate. Further, the MOS device includes a first heavily-doped region formed in the first lightly-doped region, and a second heavily-doped region formed in the second lightly-doped region. The MOS device also includes a first high-low-voltage gate oxide boundary arranged between the first heavily-doped region and the gate, and a second high-low-voltage gate oxide boundary arranged between the second heavily-doped region and the gate. The gate covers the first high-low-voltage gate oxide boundary and the second high-low-voltage gate oxide boundary at the first side and the second side of the gate, respectively.

Another aspect of the present disclosure includes a method for fabricating a Metal-Oxide-Semiconductor (MOS) device on a semiconductor wafer. The method includes providing a substrate including an epitaxial layer, forming a well region in the epitaxial layer of the substrate, and forming a high-voltage region including a gate region using a photoetching process. The method also includes forming a first high-low-voltage gate oxide boundary and a second high-low-voltage gate oxide boundary on the well region at a first side and a second side of the gate region, respectively. Further, the method includes forming a gate oxide layer on the gate region, and forming a low-voltage region including a first predetermined area for a first heavily-doped region and a second predetermined area for a second heavily-doped region by etching and removing the first high-low-voltage gate oxide boundary and the second high-low-voltage gate oxide boundary at the first predetermined area and the second predetermined area, respectively. The method also includes forming a gate at the gate region, wherein the gate covers the first high-low-voltage gate oxide boundary and the second high-low-voltage gate oxide boundary at the first side and the second side of the gate region, respectively.

Other aspects of the present disclosure can be understood by those skilled in the art in light of the description, the claims, and the drawings of the present disclosure.

BRIEF DESCRIPTION OF THE DRAWINGS

FIGS. 4-9 illustrate corresponding stages of the MOS device during the fabricating process consistent with the disclosed embodiments.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
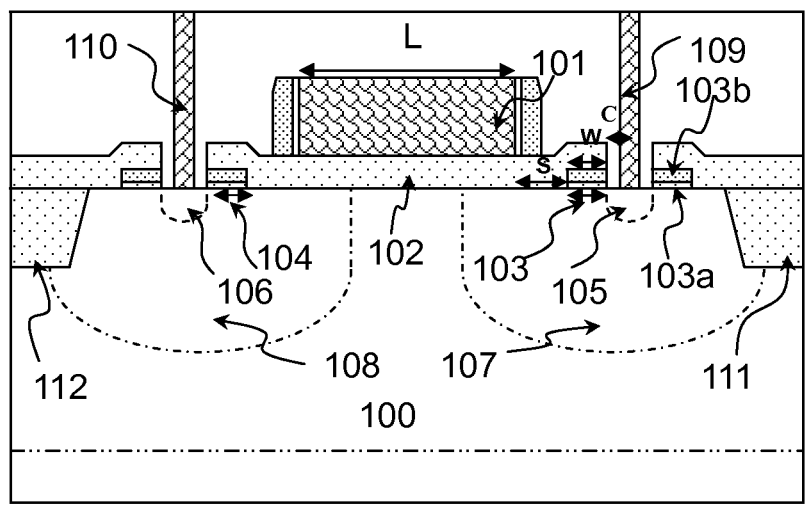
FIG. 1 shows a conventional MOS device.
Figure 2:
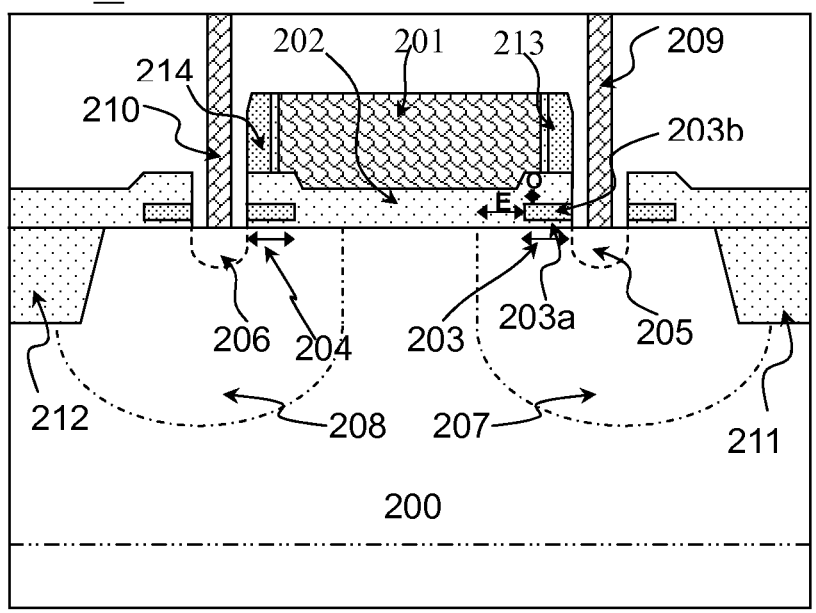
FIG. 2 shows an exemplary MOS device consistent with the disclosed embodiments.

FIG. 2 illustrates an exemplary metal-oxide-semiconductor (MOS) device 20 consistent with the disclosed embodiments. As shown in FIG. 2, the MOS device 20 includes a substrate (not numbered), a well region 200 formed in the substrate, a gate oxide 202 located on the well region 200, and a gate 201 located on the gate oxide 202. The MOS device 20 also includes a source region containing a source heavily-doped region 205 and a source lightly-doped region 207, and a drain region containing a drain heavily-doped region 206 and a drain lightly-doped region 208. Both the source region and the drain region may be formed in the well region.

Further, the MOS device 20 includes shallow trench isolations (STIs) 211 and 212 which are used to isolate the source and drain regions of the MOS device 20. The STIs 211 and 212 may be respectively arranged at outer boundaries of the source lightly-doped region 207 and the drain lightly-doped region 208 in the well region 200.

The lightly-doped regions (e.g., the source lightly-doped region 207 and the drain lightly-doped region 208) may be formed in the well region 200. The source lightly-doped region 207 and the drain lightly-doped region 208 are respectively arranged at the two sides of the gate 201, and are partially overlapped with the gate oxide 202 below the gate 201. That is, the source lightly-doped region 207 may be formed at one side of the gate 201 and overlapping with the gate 201, and the drain lightly-doped region 208 may be formed at another side of the gate 201 and also overlapping with the gate 201.

The heavily-doped regions (e.g., source heavily-doped region 205 and drain heavily-doped region 206) are located respectively at the two sides of the gate 201, and high-low-voltage gate oxide boundaries 203 and 204 are arranged at each side of the source heavily-doped region 205 and the drain heavily-doped region 206, respectively. The MOS device 20 also includes a contact hole 209 extending to the source heavily-doped region 205 and a contact hole 210 extending to the drain heavily-doped region 206.

In certain embodiments, the high-low-voltage gate oxide boundaries 203 and 204 are located below the gate 201. In other words, the gate 201 may cover the high-low-voltage gate oxide boundaries 203 and 204 at the corresponding sides of the gate 201. Further, the MOS device 20 includes side walls 213 and 214 located respectively at the two sides of the gate 201. The side wall 213 may be located above the high-low-voltage gate oxide boundary 203 and overlapping with the high-low-voltage gate oxide boundary 203; and the side wall 214 may be located above the high-low-voltage gate oxide boundary 204 and overlapping with the high-low-voltage gate oxide boundary 204.

More particularly, the high-low-voltage gate oxide boundaries 203 and 204 may be located entirely or partly below the gate 201 and overlapping with the gate 201. When there are side walls 213 and 214 arranged respectively at the two sides of the gate 201, the high-low-voltage gate oxide boundaries 203 and 204 may be located entirely or partly below the gate 201 and the side walls 213 and 214 and overlapping with the gate 201 and the side walls 213 and 214. The high-low-voltage gate oxide boundaries 203 and 204 may be arranged symmetrically along the gate 201.

If the distance between the contact hole 209 and the high-low-voltage gate oxide boundary 203 at one side of the gate 201 is C; the width of the high-low-voltage gate oxide boundary 203 at one side of the gate 201 is W; the length of the overlapped region between the gate 201 and the high-low-voltage gate oxide boundary 203 at one side of the gate 201 is O; and the width of the gate 201 is L, the device space (the distance between the source and the drain contact hole 209 and 210) is then $L+2W-2O+2C$. Thus, the device space of the MOS device 20 is less than that of the conventional MOS device 10.

Further, the length O of the overlapped region between the gate 201 and the high-low-voltage gate oxide boundary 203 at one side of the gate 201 can be determined based on the deviation of photoetching and aligning in the fabricating process. For example, when the fabricating process uses the 0.18 μm technology, the length O may be determined as not less than 0.3 μm. For a high voltage device, because the length of the gate, the length of the source lightly-doped region, and the length of the drain lightly-doped region may be relatively large, the high-low-voltage gate oxide boundaries left after forming the heavily-doped regions 207 and 208 can be easily arranged below the gate 201 and the side walls 213 and 214 if the length O is not less than 0.3 μm. That is, the length O may be determined as sufficiently greater than the deviation of photoetching and aligning in the fabricating process to ensure a certain portion of the high-low-voltage gate oxide boundaries remaining after forming the heavily-doped regions 207 and 208.

The high-low-voltage gate oxide boundary 203 may further include a buffer oxide layer 203a and a nitride layer 203b arranged in a vertical direction (or other directions). The buffer oxide layer 203a may be formed on the surface of the semiconductor substrate, the nitride layer 203b may be formed on the buffer oxide 203a, and the gate oxide 202 may be formed on the nitride 203b. Similarly, the high-low-voltage gate oxide boundary 204 may have the same structure as the high-low-voltage gate oxide boundary 203.

The source heavily-doped region 205 may be formed at the source lightly-doped region 207 and the drain heavily-doped region 206 may be formed at the drain lightly-doped region 208. The area of the source heavily-doped region 205 and the drain heavily-doped region 206 may be determined based on particular device applications. The high-low-voltage gate oxide boundaries 203 and 204 may be used to surround the heavily-doped regions 205 and 206, and the size of the overlapped region between the high-low-voltage gate oxide boundary 203 (or 204) and the gate 201 is smaller than the size of the overlapped region between the lightly-doped region 207 (or 208) and the gate 201. The difference between these two is represented as E, which is greater than zero so as to protect the gate oxide 202 from being affected.

Further, with respect to the high-low-voltage gate oxide boundary 203 (or 204), the nitride layer 203b may be a nitride film used to protect the low voltage region of the MOS device 20 from over-loss of field oxide film (oxide between the STIs 211 and 212) and affecting the yield while removing the gate oxide 202 in the low voltage region. The buffer oxide layer 203a may be used for buffering the growth of the subsequent nitride layer 203b to reduce the surface stress of the substrate wafer.

The gate oxide 202 may be formed after the process of photoetching the high voltage region of the MOS device 20. In the step of photoetching the low voltage region, the remaining nitride layer 203b, buffer oxide 203a, and the gate oxide 202 above the nitride layer 203b need to be removed, in order to form the source heavily-doped region 205 and the drain heavily-doped region 206, respectively, at the low voltage region by the subsequent processes. However, because of the deviation of photoetching and aligning, not all the remaining nitride layer 203b and buffer oxide 203a are removed. Thus, there are still nitride layer 203b, buffer oxide 203a, and gate oxide 202 remained at each of the two sides of the finally formed heavily-doped regions 205 and 206. Therefore, high-low-voltage gate oxide boundaries 203 and 204 remain at each of the two sides of the heavily-doped regions 205 and 206.

Because the high-low-voltage gate oxide boundaries 203 and 204 at each side of the gate 201 are located below the gate 201, such high-low-voltage gate oxide boundaries 203 and 204 do not take extra space of the MOS device 20. Thus, the device space can be effectively reduced and more devices can be manufactured by using the fixed-size wafer. That is, the distance between the source heavily-doped region 205 and the drain heavily-doped region 206 is determined based on the overlapping between the gate 201 and the source and drain high-low-voltage gate oxide boundaries 203 and 204 so as to reduce this distance (or device space).

Further, because the high-low-voltage gate oxide boundaries 203 and 204 at each side of the gate 201 are located below the gate 201, parasitic capacitance of overlapped regions of the gate 201 can be effectively reduced, and latency of the MOS device 20 in switching operation can also be effectively reduced. Such arrangement can also reduce the vertical electric field of the MOS device 20, increase the migration rate of the current carrier, and reduce the drain current. Furthermore, such arrangement can reduce the resistance of the drift region and increase the drive current of the device while the size of the drifting region is reduced.

Figure 3:
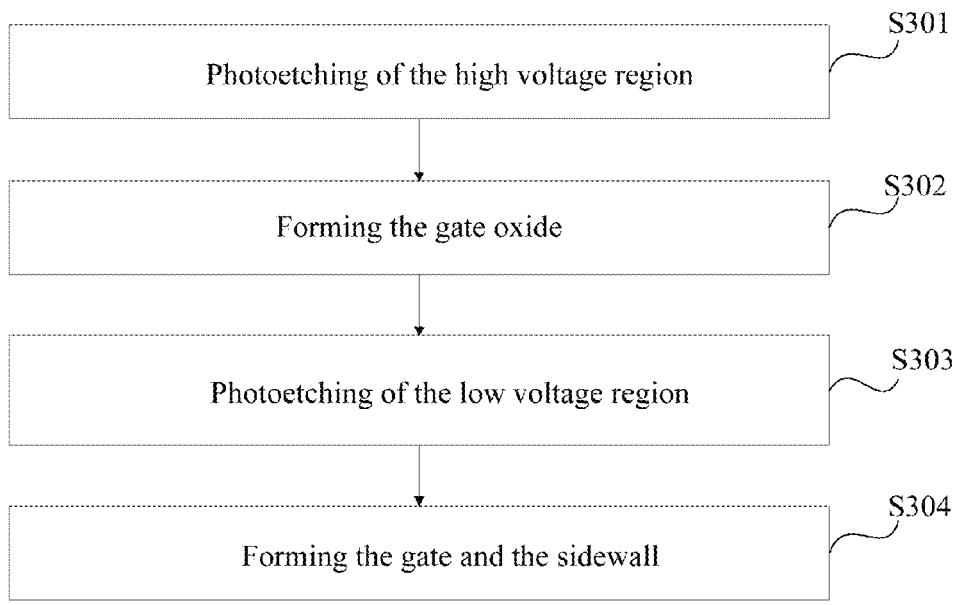
FIG. 3 shows an exemplary process for fabricating the MOS device consistent with the disclosed embodiments.

FIG. 3 illustrates an exemplary process for fabricating the MOS device 20 consistent with the disclosed embodiments. To fabricate the MOS device 20, a semiconductor substrate may be provided and prepared. The substrate may include any appropriate material for making a MOS device.

For example, the substrate may include a semiconductor structure, e.g., silicon, silicon germanium (SiGe) with a monocrystalline, polycrystalline, or amorphous structure. The substrate may also include a hybrid semiconductor structure, e.g., carborundum, indium antimonide, lead telluride, indium arsenide, indium phosphide, gallium arsenide or gallium antimonide, alloy semiconductor, or a combination thereof. Further, the substrate may include a silicon-on-insulator (SOI) structure. In addition, the substrate may also include other materials, such as a multi-layered structure of epitaxial layer or buried layer.

The substrate may also include an epitaxial layer, and a well region is formed in the epitaxial layer of the substrate. Shallow trench isolations (STIs) may also be formed in the well region to isolate the source and drain regions of the MOS device, and the source lightly-doped region and the drain lightly-doped region are further formed in the well region.

Further, a high voltage region may be formed using a photoetching process (S301). The high voltage region includes a gate region. To form the high voltage region, a drain high-low-voltage gate oxide boundary and a source high-low-voltage gate oxide boundary may be formed on the surface of the well region in the epitaxial layer of the substrate. The locations of the high-low-voltage gate oxide boundaries may be predetermined based on the gate region. Further, the distance between the drain high-low-voltage gate oxide boundary and the source high-low-voltage gate oxide boundary may be also determined in a way such that the distance between a predetermined source heavily-doped region and a predetermined drain heavily-doped region can be formed by subsequent processes in accordance with the sum of a predetermined width of a gate and a predetermined distance between side walls at two sides of the gate.

Figure 4:
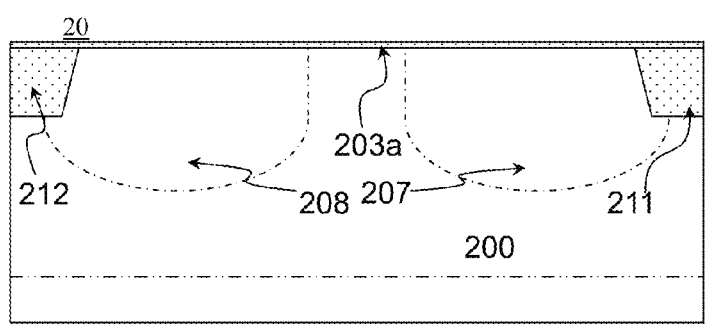

More specifically, to form the drain high-low-voltage gate oxide boundary and the source high-low-voltage gate oxide boundary, a block oxide may first be formed on the well region in the epitaxial layer of the substrate wafer. FIG. 4 shows a corresponding MOS device 20 after forming the block oxide.

As shown in FIG. 4, MOS device 20 in the fabricating process has well region 200; STIs 211 and 212; source lightly-doped region 207; drain lightly-doped region 208; and buffer oxide layer 203a. The buffer oxide layer 203a may be formed by a high temperature oxidation process or a CVD process and may be used for buffering the growth of the nitride layer to be formed by a subsequent process to reduce the surface stress of the substrate wafer. Further, the distance between the STI 211 and the STI 212 of the MOS device 20 may be determined based on the reduced distance between the drain high-low-voltage gate oxide boundary and the source high-low-voltage gate oxide boundary. Thus, the size of the source lightly-doped region 207 and the size of the drain lightly-doped region 208 may also be reduced.

After forming the block oxide layer, a nitride layer is formed on the block oxide. FIG. 5 shows the corresponding MOS device 20 after forming the nitride layer. As shown in FIG. 5, the nitride layer 203b is formed on the block oxide layer 203a. The nitride layer 203b may be used for protecting the low voltage region from extra loss of field oxide film (the oxide between the STIs 211 and 212) during the high voltage region processes to increase the yield of the device.

After forming the nitride layer, the nitride layer and the block oxide layer in the high voltage region are etched and removed, and the remaining nitride and block oxide together form the source high-low-voltage gate oxide boundary and the drain high-low-voltage gate oxide boundary. FIG. 6 shows the corresponding MOS device 20 after removing the nitride layer and the block oxide layer in the high voltage region.

As shown in FIG. 6, a photoresist mask 215 may be used to etch away the nitride layer and the block oxide layer in the high voltage region. A source high-low-voltage gate oxide boundary 203 and a drain high-low-voltage gate oxide boundary 204 are formed by the remaining nitride layer and the block oxide layer after removing the nitride layer and the block oxide layer in the high voltage region. The distance between the source high-low-voltage gate oxide boundary 203 and the drain high-low-voltage gate oxide boundary 204 may be determined based on the reduced length of the overlapped regions between the high-low-voltage gate oxide boundaries and the gate (or gate region).

Returning to FIG. 3, after the high voltage region is formed by the photoetching process (S301), a gate oxide is formed on the surface of the substrate (S302). FIG. 7 shows a gate oxide layer 202 formed on the surface of the substrate (also covering the high-low-voltage gate oxide boundaries). The gate oxide 202 can be formed by a high temperature oxidation process.

Further, a low voltage region is formed by photoetching (S303). To form the low voltage region, the high-low-voltage gate oxide boundaries at a predetermined area for a source heavily-doped region and a predetermined area for a drain heavily-doped region are etched and removed respectively. In other words, the low-voltage region includes the predetermined area for the source heavily-doped region and the predetermined area for the drain heavily-doped region. FIG. 8 shows the corresponding MOS device 20 after removing portions of the high-low-voltage gate oxide boundaries in the low voltage region.

As shown in FIG. 8, a photoresist mask 215 may be used to etch and remove the high-low-voltage gate oxide boundaries in the low voltage region. After the low voltage region is photoetched, the source heavily-doped region and drain heavily-doped region are formed at the etched region by subsequent processes. Because of the deviation of photoetching and aligning, not all the remaining nitride 203b and buffer oxide 203a are removed, and thus high-low-voltage gate oxide boundaries remain on each of the two sides of the finally formed heavily-doped regions. The remaining high-low-voltage gate oxide boundaries are considered as the high-low-voltage gate oxide boundaries as well, which are overlapped or covered by the gate region.

Further, a gate and side walls of the gate are formed on the gate oxide between the predetermined source heavily-doped region and the predetermined drain heavily-doped region (S304). FIG. 9 shows the corresponding MOS device 20 after forming the gate and side walls.

As shown in FIG. 9, the gate 201 and the side walls 213 and 214 are arranged between the source high-low-voltage gate oxide boundary 203 and the drain high-low-voltage gate oxide boundary 204. More particularly, the gate 201 and side wall 213 may cover the source high-low-voltage gate oxide boundary 203 at the gate side after being etched, and gate 201 and side wall 214 may also cover drain high-low-voltage gate oxide boundary 204 at the gate side after being etched such that the device space may be reduced.

Furthermore, the source heavily-doped region 205 and the drain heavily-doped region 206 are formed and a dielectric layer may also be formed on the surface of the substrate. Contact holes may then be formed in the dielectric layer to extend to the source region and drain region and metal linking is used to form the drain and source and so on.

Further, because the high-low-voltage gate oxide boundaries 203 and 204 at each side of the gate 201 are located below the gate 201, parasitic capacitance of overlapped regions of the gate 201 can be effectively reduced, and latency of the MOS device 20 in switching operation can also be effectively reduced. Such arrangement can also reduce the vertical electric field of the MOS device 20, increase the migration rate of the current carrier, and reduce the drain current. Furthermore, such arrangement can also reduce the resistance of drift regions and increase the drive current of the device while the size of the drifting region is reduced By using the disclosed methods and devices/systems, the high-low-voltage gate oxide boundaries near each side of the gate can be located below the gate, so that high-low-voltage gate oxide boundaries do not taking extra space of the MOS device. Thus, the device space can be effectively reduced and more devices can be manufactured in the semiconductor wafer of a fixed size and, moreover, the production efficiency and the density of IC integration can be effectively increased and the cost can be effectively reduced.

Further, after moving the high-low-voltage gate oxide boundaries under the gate, parasitic capacitance of overlapped regions of the gate can be effectively reduced, and the latency of the MOS device in switching operation can also be effectively reduced. Further, placing high-low-voltage gate oxide boundaries below the gate can also reduce the vertical electric field of the MOS device, increase the migration rate of the current carrier, and reduce the drain current. Furthermore, placing high-low-voltage gate oxide boundaries below the gate can also reduce the resistance of drift regions and increase the drive current of the device while the size of the drifting region is reduced.

It is understood that the disclosed embodiments may be applied to any appropriate semiconductor device manufacturing processes. Various alternations, modifications, or equivalents to the technical solutions of the disclosed embodiments can be obvious to those skilled in the art.

What is claimed is:

1. A Metal-Oxide-Semiconductor (MOS) device, comprising:
   a substrate;
   a well region formed in the substrate;
   a gate located on the substrate;
   a first lightly-doped region arranged in the well region at a first side of the gate and overlapping with the gate;
   a second lightly-doped region arranged in the well region at a second side of the gate and overlapping with the gate;
   a first heavily-doped region formed in the first lightly-doped region;
   a second heavily-doped region formed in the second lightly-doped region;
   a first high-low-voltage gate oxide boundary arranged between the first heavily-doped region and the gate; and
   a second high-low-voltage gate oxide boundary arranged between the second heavily-doped region and the gate,
   wherein the first high-low-voltage gate oxide boundary includes a nitride layer and a buffer oxide layer, aligned sequentially above the first heavily-doped region at the first side of the gate, and the first high-low-voltage gate oxide boundary is located below the gate and a gate sidewall at the first side of the gate and has an outer edge aligned with or within an outer edge of the gate sidewall without taking extra space of the MOS device; and
   wherein the second high-low-voltage gate oxide boundary includes a nitride layer and a buffer oxide layer, aligned sequentially above the second heavily-doped region at the second side of the gate, and the second high-low-voltage gate oxide boundary is located below the gate and the gate sidewall at the second side of the gate, and has an outer edge aligned with or within an outer edge of the gate sidewall without taking extra space of the MOS device.

2. The MOS device according to claim 1, wherein:
   a distance between the first heavily-doped region and the second heavily-doped region is predetermined based on the overlapping between the gate and the first and second high-low-voltage gate oxide boundaries so as to reduce the distance.

3. The MOS device according to claim 1, wherein:
   the first lightly-doped region is a source lightly-doped region;
   the first heavily-doped region is a source heavily-doped region;
   the first high-low-voltage gate oxide boundary is a source high-low-voltage gate oxide boundary;
   the second lightly-doped region is a drain lightly-doped region;
   the second heavily-doped region is a drain heavily-doped region; and
   the second high-low-voltage gate oxide boundary is a drain high-low-voltage gate oxide boundary.

4. The MOS device according to claim 1, wherein:
   the gate includes a gate oxide arranged on the well region and the gate sidewall surrounding the gate and on the gate oxide.

5. The MOS device according to claim 1, further including:
   a first contact hole extending to the first heavily-doped region; and
   a second contact hole extending to the second heavily-doped region.

6. The MOS device according to claim 1, further including:
   shallow trench isolations formed in the well region, wherein the first lightly-doped region and the second lightly-doped region are located between the shallow trench isolations.

7. A method for fabricating a Metal-Oxide-Semiconductor (MOS) device on a semiconductor wafer, comprising:
   providing a substrate including an epitaxial layer;
   forming a well region in the epitaxial layer of the substrate;
   forming a high-voltage region including a gate region using a photoetching process;

forming a first high-low-voltage gate oxide boundary and a second high-low-voltage gate oxide boundary on the well region at a first side and a second side of the gate region, respectively;

forming a gate oxide layer on the gate region;

forming a low-voltage region including a first predetermined area for a first heavily-doped region and a second predetermined area for a second heavily-doped region by etching and removing the first high-low-voltage gate oxide boundary and the second high-low-voltage gate oxide boundary at the first predetermined area and the second predetermined area, respectively;

forming a gate at the gate region; and forming a gate sidewall surrounding the gate and on the gate oxide, wherein:

the first high-low-voltage gate oxide boundary is located below the gate and the gate sidewall at the first side of the gate and has an outer edge aligned with or within an outer edge of the gate sidewall without taking extra space of the MOS device; and the second high-low-voltage gate oxide boundary is located below the gate and the gate sidewall at the second side of the gate, and has an outer edge aligned with or within an outer edge of the gate sidewall without taking extra space of the MOS device.

8. The method according to claim 7, before forming the high-voltage region, further including:

forming a first lightly-doped region in the well region at the first side of the gate region and overlapping with the gate region; and forming a second lightly-doped region in the well region at the second side of the gate region and overlapping with the gate region.

9. The method according to claim 8, further including:

forming the first heavily-doped region in the first lightly-doped region; and forming the second heavily-doped region in the first second lightly-doped region;

wherein a distance between the first heavily-doped region and the second heavily-doped region is predetermined based on the overlapping between the gate region and the first and second high-low-voltage gate oxide boundaries so as to reduce the distance.

10. The method according to claim 9, wherein:

the first lightly-doped region is a source lightly-doped region;

the first heavily-doped region is a source heavily-doped region;

the first high-low-voltage gate oxide boundary is a source high-low-voltage gate oxide boundary;

the second lightly-doped region is a drain lightly-doped region;

the second heavily-doped region is a drain heavily-doped region; and the second high-low-voltage gate oxide boundary is a drain high-low-voltage gate oxide boundary.

11. The method according to claim 7, wherein forming the high-voltage region further includes:

forming a block oxide layer on the well region in the epitaxial layer;

forming a nitride layer on the block oxide layer;

forming a high-voltage region photoresist pattern on the nitride layer;

etching away the nitride layer and the block oxide in the high voltage region using the photoresist pattern as a mask; and using the remaining nitride layer and block oxide layer to form the first high-low-voltage gate oxide boundary and the second high-low-voltage gate oxide boundary.

12. The method according to claim 9, further including:

forming a first contact hole extending to the first heavily-doped region; and forming a second contact hole extending to the second heavily-doped region.

13. The MOS device according to claim 1, wherein the gate covers the entire first high-low-voltage gate oxide boundary and the entire second high-low-voltage gate oxide boundary at the first side and the second side of the gate, respectively.

14. The MOS device according to claim 1, wherein the gate sidewall and edge portions of each of the first side and the second side of the gate is distanced from a top surface of the substrate by a height greater than a height of a center portion of the gate distanced from the top surface of the substrate.

15. The method according to claim 7, wherein the gate covers the entire first high-low-voltage gate oxide boundary and the entire second high-low-voltage gate oxide boundary at the first side and the second side of the gate, respectively.

16. The method according to claim 7, wherein the gate sidewall and edge portions of each of the first side and the second side of the gate is distanced from a top surface of the substrate by a height greater than a height of a center portion of the gate distanced from the top surface of the substrate.

* * * * *